(12) United States Patent
Huang et al.

(10) Patent No.: US 9,030,025 B2
(45) Date of Patent: May 12, 2015

(54) INTEGRATED CIRCUIT LAYOUT

(71) Applicants: Chao-Yuan Huang, Hsinchu (TW);
Yueh-Feng Ho, Hsinchu (TW);
Ming-Sheng Yang, Hsinchu (TW);
Hwi-Huang Chen, Hsinchu (TW)

(72) Inventors: Chao-Yuan Huang, Hsinchu (TW);
Yueh-Feng Ho, Hsinchu (TW);
Ming-Sheng Yang, Hsinchu (TW);
Hwi-Huang Chen, Hsinchu (TW)

(73) Assignee: IPEnval Consultant Inc., Hsinchu (TW)

( * ) Notice: Subject to any disclaimer, the term of this patent is extended or adjusted under 35 U.S.C. 154(b) by 43 days.

(21) Appl. No.: 13/834,495

(22) Filed: Mar. 15, 2013

(65) Prior Publication Data

US 2014/0264918 A1  Sep. 18, 2014

(51) Int. Cl.
*H01L 23/48* (2006.01)

(52) U.S. Cl.
CPC ....... *H01L 23/481* (2013.01); *H01L 2924/0002* (2013.01); *H01L 2224/13* (2013.01)

(58) Field of Classification Search
None
See application file for complete search history.

(56) References Cited

U.S. PATENT DOCUMENTS

| 7,799,678 | B2 | 9/2010 | Kropewnicki et al. |
| 7,989,918 | B2 | 8/2011 | Bartley et al. |
| 8,103,996 | B2 | 1/2012 | Kariat et al. |
| 8,136,084 | B2 | 3/2012 | Dean, Jr. et al. |
| 8,319,336 | B2 | 11/2012 | Chang et al. |
| 8,332,803 | B1 | 12/2012 | Rahman |
| 8,344,749 | B2 | 1/2013 | Stillman et al. |
| 8,359,554 | B2 | 1/2013 | Wang et al. |
| 8,362,622 | B2 | 1/2013 | Sproch et al. |
| 2010/0121994 | A1 | 5/2010 | Kim et al. |
| 2010/0257495 | A1 | 10/2010 | Wu |
| 2011/0147909 | A1 | 6/2011 | Hsuan et al. |
| 2012/0106117 | A1 | 5/2012 | Sundaram et al. |
| 2012/0124532 | A1 | 5/2012 | Coteus et al. |
| 2012/0136596 | A1* | 5/2012 | Yamaoka et al. ............... 702/64 |
| 2012/0273782 | A1 | 11/2012 | Goel et al. |
| 2012/0304142 | A1 | 11/2012 | Morimoto et al. |
| 2012/0331435 | A1 | 12/2012 | Rahman |
| 2013/0075937 | A1* | 3/2013 | Wang et al. ................... 257/782 |

FOREIGN PATENT DOCUMENTS

WO  WO2012082092 A1  6/2012

* cited by examiner

*Primary Examiner* — William F Kraig
*Assistant Examiner* — Valerie N Newton
(74) *Attorney, Agent, or Firm* — Alan D. Kamrath; Kamrath IP Lawfirm, P.A.

(57) ABSTRACT

An integrated circuit layout comprises a through silicon via (TSV) configured to couple positive operational voltage VDD (VDD TSV), a through silicon via (TSV) configured to couple operational signals (signal TSV), a plurality of through silicon vias (TSVs) configured to couple operational voltage VSS (VSS TSVs) around the VDD TSV and the signal TSV and one or more backside redistribution lines (RDLs) connecting the VSS TSVs together to form a web-like heat dissipating structure at least surrounding the VDD TSV and the signal TSV.

20 Claims, 10 Drawing Sheets

INTEGRATED CIRCUIT LAYOUT

FIELD OF THE INVENTION

This invention relates generally to integrated circuit structures, and more specifically to structures with through-silicon vias.

BACKGROUND OF THE INVENTION

To save precious layout space or increase interconnect efficiency, multiple chips of integrated circuits (ICs) can be stacked together as a single IC package. To that end, a three-dimensional (3D) stack packaging technology is used to package the chips of integrated circuits. Through-silicon vias (TSVs) are widely used to accomplish the 3D stack packaging technology. A through-silicon via is a vertical conductive via completely passing through a silicon wafer, a silicon board, a substrate of any material or die. Nowadays, a 3D integrated circuit (3D IC) is applied to a lot of fields such as memory stacks, image sensors or the like.

Although through-silicon vias comes with a lot of advantages, they also introduce some issues into 3D IC architecture such as thermal mismatch, mechanical stress, heat dissipation etc. Nowadays, all the electronic devices are expected to be small, so extra heat generated by through-silicon vias would be a problem if it accumulates within the chip. Therefore, there is a need to propose an improved heat dissipating approach.

SUMMARY OF THE INVENTION

In one embodiment of the present invention, an integrated circuit layout is provided to comprise a through silicon via (TSV) configured to couple positive operational voltage VDD (VDD TSV), a through silicon via (TSV) configured to couple operational signals (signal TSV), a plurality of through silicon vias (TSVs) configured to couple operational voltage VSS (VSS TSVs) around the VDD TSV and the signal TSV and one or more backside redistribution lines (RDLs) connecting the VSS TSVs together to form a web-like heat dissipating structure at least surrounding the VDD TSV and the signal TSV.

In another embodiment of the present invention, an integrated circuit layout is provided to comprise a through silicon via (TSV) configured to couple positive operational voltage VDD (VDD TSV), a through silicon via (TSV) configured to couple operational voltage VSS (VSS TSVs), a plurality of through silicon vias (TSVs) configured to couple operational signals (signal TSV) around the VDD TSV and the VSS TSV and a plurality backside redistribution lines (RDLs), each of which connecting the signal TSVs of the same signal together to form a linear heat dissipating structure around the VDD TSV and the signal TSV.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

Figure 1:
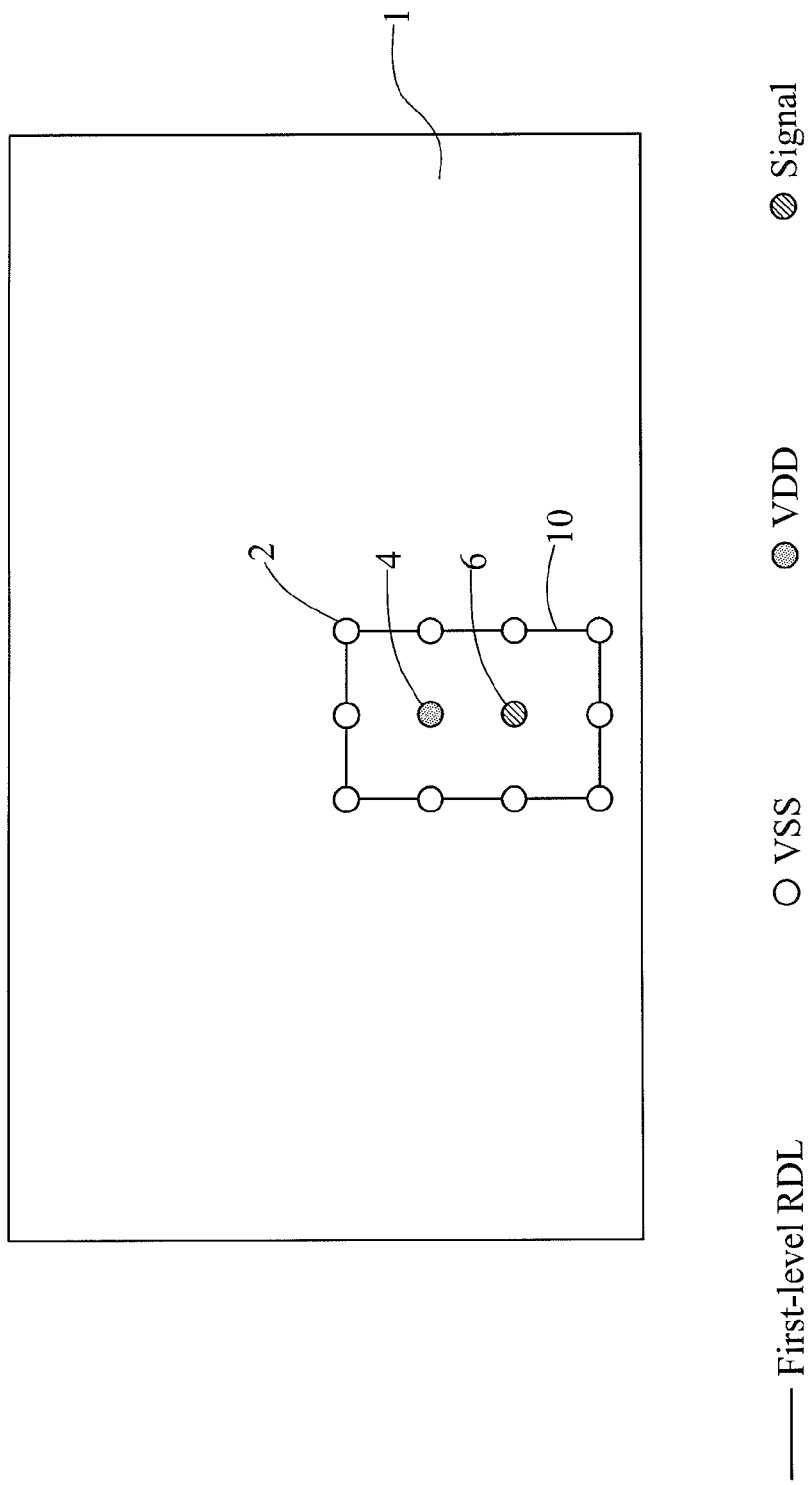
FIG. 1 shows a schematic backside view of a portion of an integrated circuit layout in accordance with an embodiment of the present invention.

Disclosed embodiments in this Disclosure are described with reference to the attached figures, wherein like reference numerals are used throughout the figures to designate similar or equivalent elements. The figures are not drawn to scale and they are provided merely to illustrate the disclosed embodiments. It should be noted that numerous specific details, relationships, and methods are set forth to provide a full understanding of the disclosed embodiments. One of ordinary skill in the pertinent art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events.

There are a lot of embodiments and figures in this application. To avoid confusions, similar components are represented by same or similar numerals. To avoid complexity and confusions, only one of the repetitive components is marked. Figures are meant to deliver the principle and spirits of this invention, so the distance, size, ratio, shape, connection relationship, etc. are examples instead of realities. Other distance, size, ratio, shape, connection relationship, etc. capable of achieving the same functions or results can be adopted as equivalents.

FIG. 1 illustrates a schematic backside view of a portion of a chip 1 in accordance with an embodiment of the present invention, wherein the backside is the side having no active devices such as transistors formed thereon. The backside is the opposite side of the front side of chip 1, wherein active devices such as transistors and interconnect structures are formed on the front side (referred to FIGS. 2 and 3 as active device layer 100). Through-silicon vias (TSVs) (in some references also known as through electrode, conductive post . . . etc.) 2, 4 and 6 pass "through" the substrate 8 of chip 1 (not shown in FIG. 1, please refer to FIGS. 2 and 3) and physically and electrically connect the backside and front side of substrate 8. TSVs 2 are configured to couple operation voltage VSS (in most cases VSS can be electrical ground, but in some cases VSS is a voltage less than VDD in strength) to the integrated circuits in the active device layer 100 of chip 1, so TSVs 2 are also known as VSS TSVs. TSV 4 (only one is shown in FIG. 1 for illustration, but many can be deployed as shown in FIG. 4-7) is configured to couple positive operation voltage (VDD) to the integrated circuits in the active device layer 100 of chip 1, so TSV 4 is also known as VDD TSV. TSV 6 is configured to relay operational signals such as clock signal to the integrated circuits in the active device layer 100 of chip 1, so TSV 6 is also known as signal TSV. On the backside of the substrate 8, in addition to TSVs of different purposes, there are backside redistribution lines (RDLs) for backside routing. The functions of RDLs can be understood as connections between TSVs and/or connections between TSV and micro bumps 20/20' (not shown in FIG. 1, please refer to FIG. 2-3), so RDLs are similar to interconnects in the active device layer 100 on the front side and may come with several layers disposed along a vertical direction within one or more dielectric/isolation layers. The RDL shown in FIG. 1 to connect the VSS TSVs is called the first-level RDL and this first-level RDL not only connect the VSS TSVs together but is also a connection between TSVs and micro bumps (not shown in FIG. 1, please refer to FIG. 2-3). The reason "the RDL" is used for FIG. 1 instead of "the RDLs" is that the RDL in FIG. 1 is physically continuous and in one structure. However, there may be other RDLs omitted from FIG. 1 such as a RDL to connect the VDD TSV to its micro bump or a RDL to connect the signal TSV to its micro bump.

Compared to normal active devices such as transistors, a TSV has a much bigger size in a scale of micrometers. In one embodiment, a TSV has a diameter of 30 µm. In another embodiment, a TSV has a diameter of 10 µm. In a further embodiment, a TSV has a diameter of 6 µm. FIG. 1 only shows a portion of the backside of chip 1 for illustration purpose, however, there may be hundreds or thousands of TSVs spreading over the backside of chip 1 to occupy not the entire backside area but most of the backside area. The occupied area of the TSVs can range from several percent to more than 90 percent of backside area of chip 1. Considering the complexity of the integrated circuits on the front side of chip 1, manufacturing ability, thermal and mechanical impact and cost, the distances between different TSVs, quantity of each kind of TSVs (that is, VSS TSVs, VDD TSVs and signal TSVs) and quantity of layers of RDLs may vary in a wide range. In a case where the quantity of VSS TSVs is much more than the quantity of VDD TSVs and signal TSVs as shown in FIG. 1, arranging the VSS TSVs around the VDD TSVs and signal TSVs and connecting the VSS TSVs together with the first-level RDL as shown in FIG. 1 would increase the heat dissipation and shield the VDD TSVs and signal TSVs from external interferences. By arranging a large number of VSS TSVs around the VDD TSVs and signal TSVs and connecting them with a RDL/RDLs to form a web-like structure, heat generated by these TSVs can be distributed better and dissipated via a larger surface area.

Figure 10:
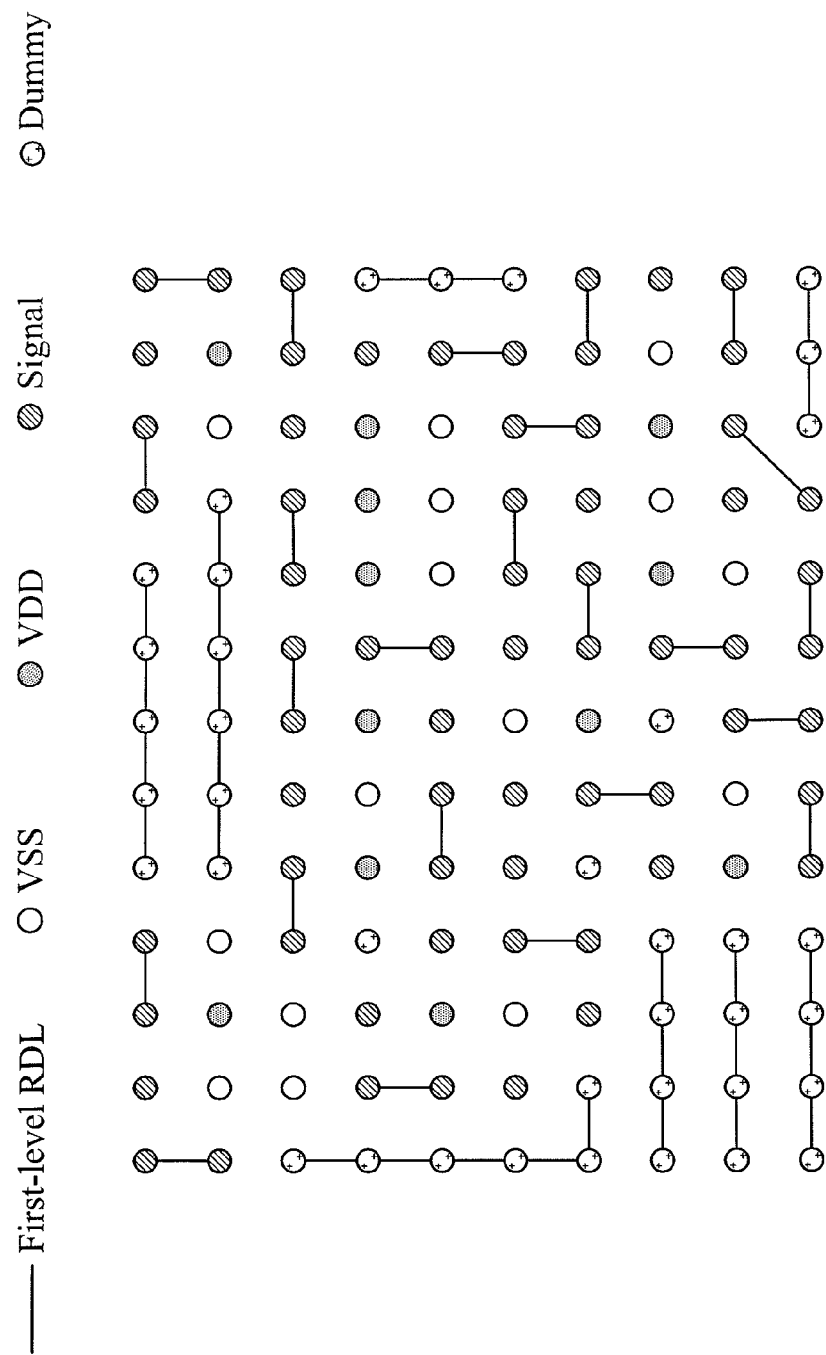
FIG. 10 shows a backside view of an integrated circuit layout in accordance with still another embodiment of the present invention.

However, in a case where the quantity of VSS TSVs is not more than the quantity of VDD TSVs and signal TSVs, the arrangement can be modified accordingly. For example, when more signal TSVs are required in an application to make the quantity of signal TSVs much more than the quantity of VSS TSVs and VDD TSVs combined or separately as shown in FIG. 10, it is possible to arrange signal TSVs sharing the same signal around the VSS TSVs and VDD TSVs and connect these signal TSVs together with a RDL/RDLs, that is, switch the roles of VSS TSVs and signal TSVs and let signal TSVs and the RDL/RDLs connecting them form a linear, irregular-shaped or web-like structure. Same principle applies to a case where the quantity of VDD TSVs is much more than the quantity of VSS TSVs and signal TSVs.

Figure 2:
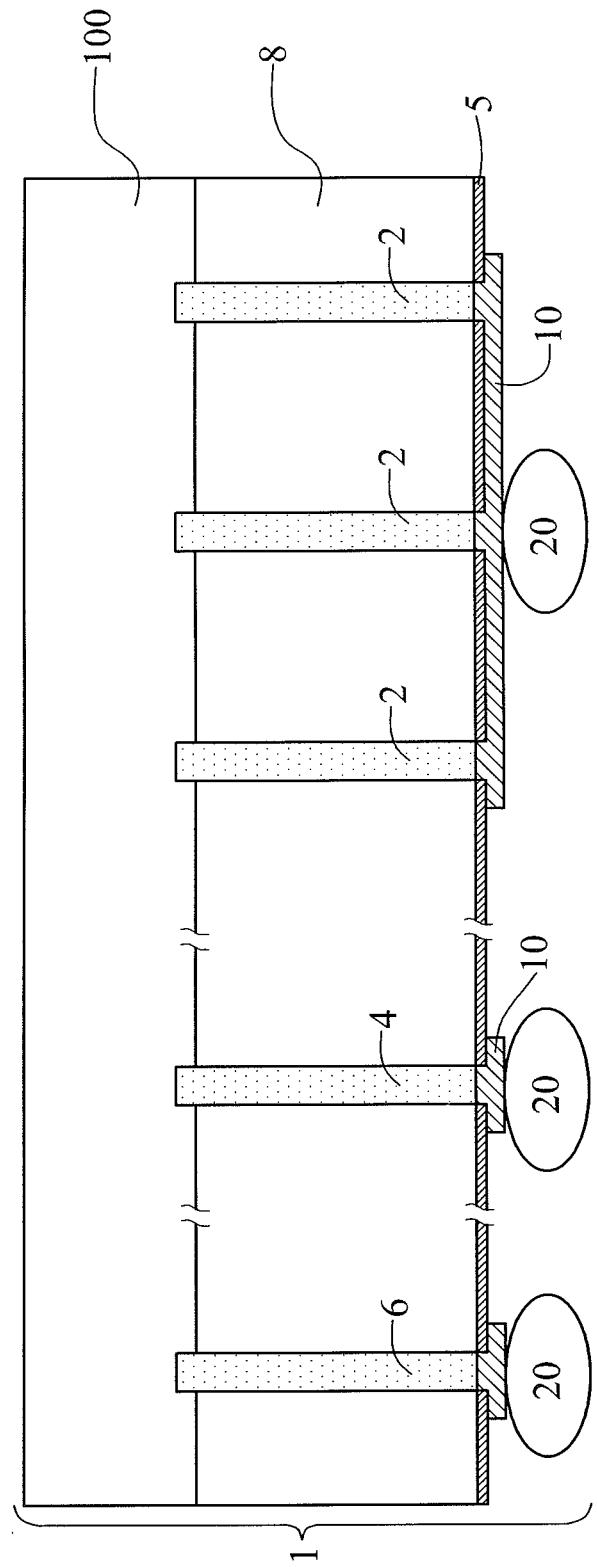
FIG. 2 shows a schematic cross-sectional view of the structure shown in FIG. 1 in accordance with an embodiment of the present invention.
Figure 3:
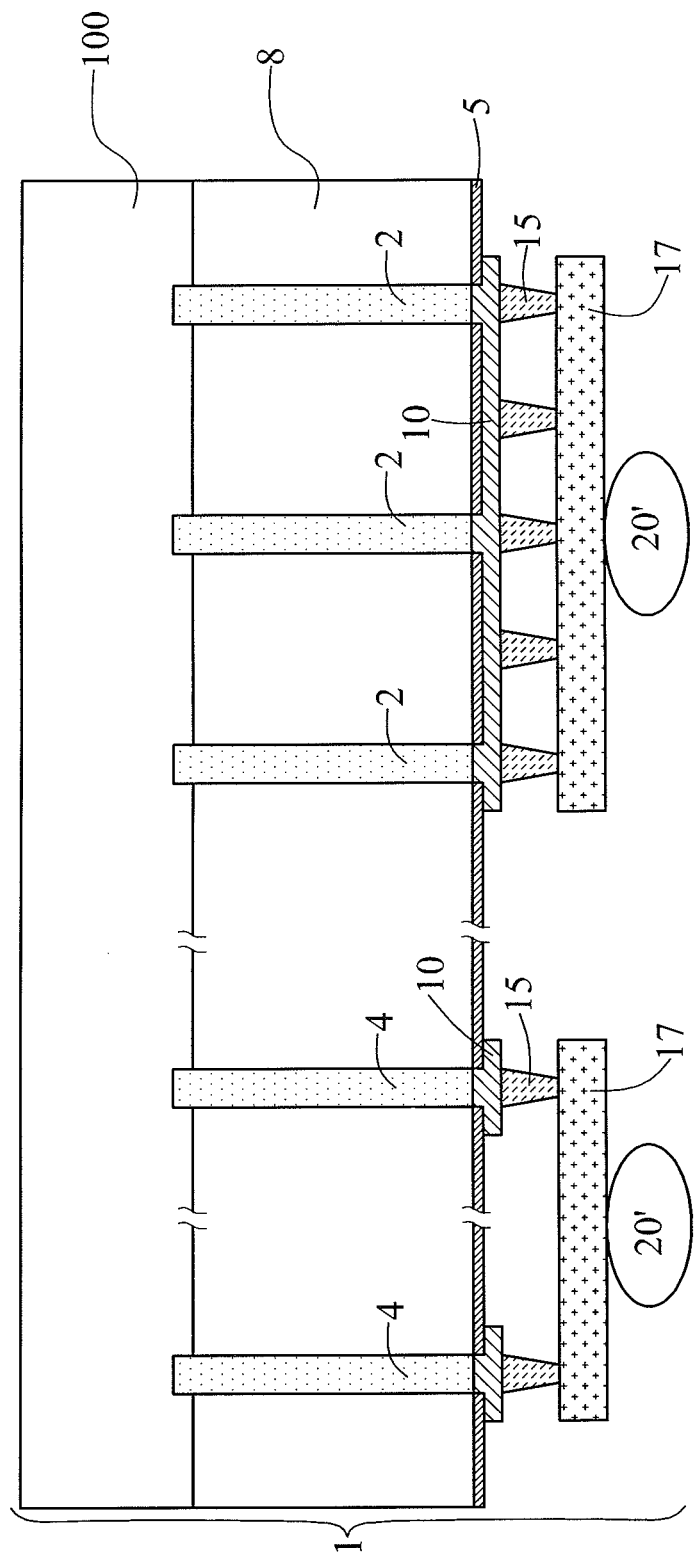
FIG. 3 shows a schematic cross-sectional view of the structure shown in FIG. 1 in accordance with another embodiment of the present invention.

Now refer to FIGS. 2 and 3, they show schematic cross-sectional views of the structure shown in FIG. 1 in accordance with different embodiments of the present invention. In FIG. 2, chip 1 comprises: a substrate 8; an active device layer 100 disposed on the substrate 8; VSS TSVs 2, a VDD TSV 4 and a signal TSV 6 configured to connect the front side of substrate 8 and the backside thereof; a patterned underlying isolation layer 5 configured to isolate different first-level RDLs 10; a first-level RDL 10 configured to connect different VSS TSVs 2 together and other first-level RDLs 10 to connect TSVs to their micro bumps 20; and micro bumps 20. The substrate 8 can be a Si substrate, a polymer substrate, a silicon-on-insulator substrate, a SiC substrate, a composite substrate . . . etc. The active device layer 100 mainly comprises transistors, memory cells, circuitries of different functions, passive devices such as capacitors, resistors and/or inductors, and interconnects used for electrical signal and voltage routing. It is noted that in a case where the substrate 8 and TSVs are used as an interposer, the active device layer 100 can be omitted, that is, the active device layer 100 is an optional layer than necessary layer for chip 1.

The TSVs may be made from a via first process (via is made before transistors), a via middle process (via is made after transistors and during lower interconnects) or a via last process (via is made after interconnects). No matter what kind of process is adopted to fabricate TSVs, the basic structure of TSVs are the same: a through-silicon hole, a dielectric layer lining the sidewall of the through-silicon hole, and a conductive material filled in the through-silicon hole. The material/materials used for the dielectric layer and the conductive material may depend on the manufacturing process and the physical properties needed. Silicon oxide and/or silicon nitride are the most commonly used material/materials for the dielectric layer. As to the conductive material, it may comprise a barrier/glue layer material such as Ta, TaN, Ti, TiN, W, WN, Mo, Mn, Cu . . . etc. and a low-resistivity material such as W, Cu, Al, poly silicon . . . etc. The first-level RDLs 10 may contain the same materials commonly used for interconnects on the front side of the substrate 8, so the RDLs and the TSVs may use the same barrier/glue layer material such as Ti and TiN and the same low-resistivity material such as Cu or the RDLs and the TSVs may simply use different materials. The micro bumps 20 are external interfaces to another chip or an interposer or a printed circuit board and there is no limit to its material as long as it is conductive.

In FIG. 2, the three VSS TSVs 2 connected by the first-level RDL 10 represent three adjacent VSS TSVs 2 of all VSS TSVs 2 connected by the first-level RDL 10 shown in FIG. 1. Since all the VSS TSVs 2 in FIG. 1 are connected together by the first-level RDL 10, they are at the same voltage level and several of them may share the same micro bump 20. In FIG. 2, 3 VSS TSVs share the same micro bump 20 through a first-level RDL 10, but more VSS TSVs such as 4 VSS TSVs or less VSS TSVs such as 2 VSS TSVs may share the same micro bump through a first-level RDL 10. Therefore, for all the VSS TSVs shown in FIG. 1, they can connect to several micro bumps through one first-level RDL 10. Also refer to FIG. 2, the VDD TSV 4 and the signal TSV 6 separated from each other and from the VSS TSVs 2 represent the VDD TSV 4 and the signal TSV 6 shown in FIG. 1. The VDD TSV 4 and signal TSV 6 are connected to different micro bumps through different first-level RDLs. It is noted that a patterned underlying isolation layer 5 composed of one or more dielectric materials is disposed between the substrate 8 and the first-level RDLs so different first-level RDLs can be electrically isolated from each other.

Now refer to FIG. 3, it is similar to the embodiment shown in FIG. 2 but the embodiment shown in FIG. 3 has not only first-level RDLs 10 but also second-level RDLs 17. In FIG. 3, the first-level RDLs 10 are connected to the second-level RDLs 17 through conductive vias 15 and the second-level RDLs 17 are connected to micro bumps 20'. It should be understood that the quantity of vias 15 and the quantity of bumps 20/20' are not critical to the present invention and a person skilled in the art can modify the quantity based on the layout and device needs.

After reading the foregoing with accompanying FIGS. 1-3, a person skilled in the art should readily appreciate principles and spirits of the present invention. The present invention provides improved integrated circuit structures with through silicon vias (TSVs) by arranging a large number of first type of TSVs around the second and/or third type of TSVs and connecting the first type of TSVs with a RDL/RDLs to form a linear, irregular-shaped or web-like structure, so heat generated by these TSVs can be distributed better and dissipated via a larger surface area. Throughout the spec of this application the term "a web-like structure" means a structure having at least a closed-loop RDL with at least one TSV in connection to it.

Figure 4:
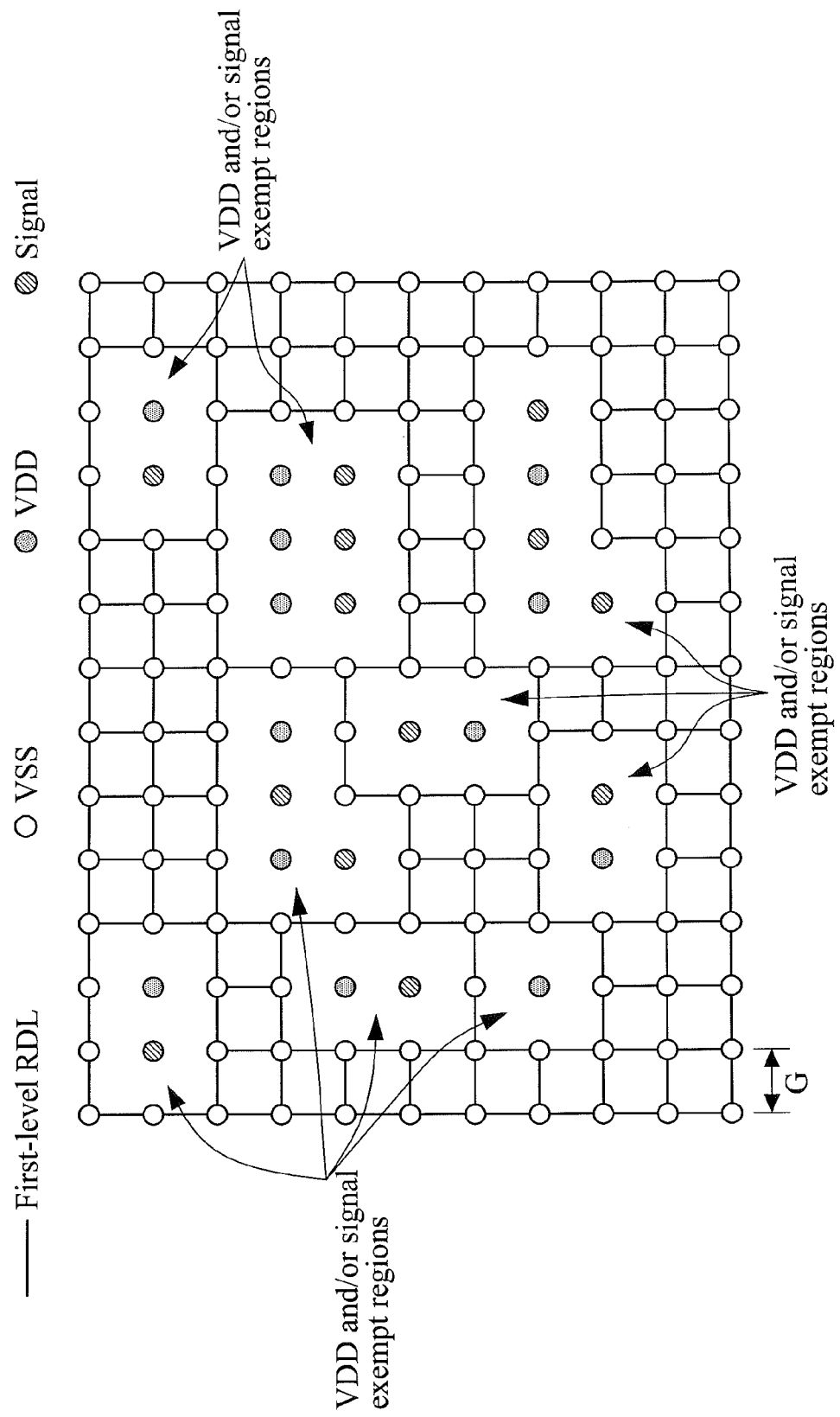
FIG. 4 shows a backside view of an integrated circuit layout in accordance with another embodiment of the present invention.

FIGS. 4-9 show the backside views of different chips in accordance with different embodiments of the present invention. In FIG. 4, all the TSVs (including all the VSS TSVs, TDD TSVs and signal TSVs) are disposed in a grid with grid distance G, every TSV is standing on a grid point and all the first-level RDL/RDLs are disposed as grid lines (horizontal and vertical). Any VDD TSV and/or signal TSV are/is surrounded by VSS TSVs and first-level RDLs connecting these VSS TSVs. All the adjacent VSS TSVs are connected by vertical and/or horizontal first-level RDLs and together they form a web-like structure so heat dissipation is significantly improved. It is noted that the grid distance G can be adjusted based on manufacturing capability, layout design, performance concerns . . . etc. Similarly, VSS TSVs and signal TSVs may swap their roles if signal TSVs outnumber VSS TSVs and VDD TSVs, hence VSS TSV and/or VDD TSVs can be surrounded by different groups of signal TSVs (that is, each group of signal TSVs share the same signal but different groups may use different signals). Same practice applies when VDD TSVs outnumber VSS TSVs and signal TSVs, then VSS TSVs and signal TSVs can be surrounded by VDD TSVs.

Figure 5:
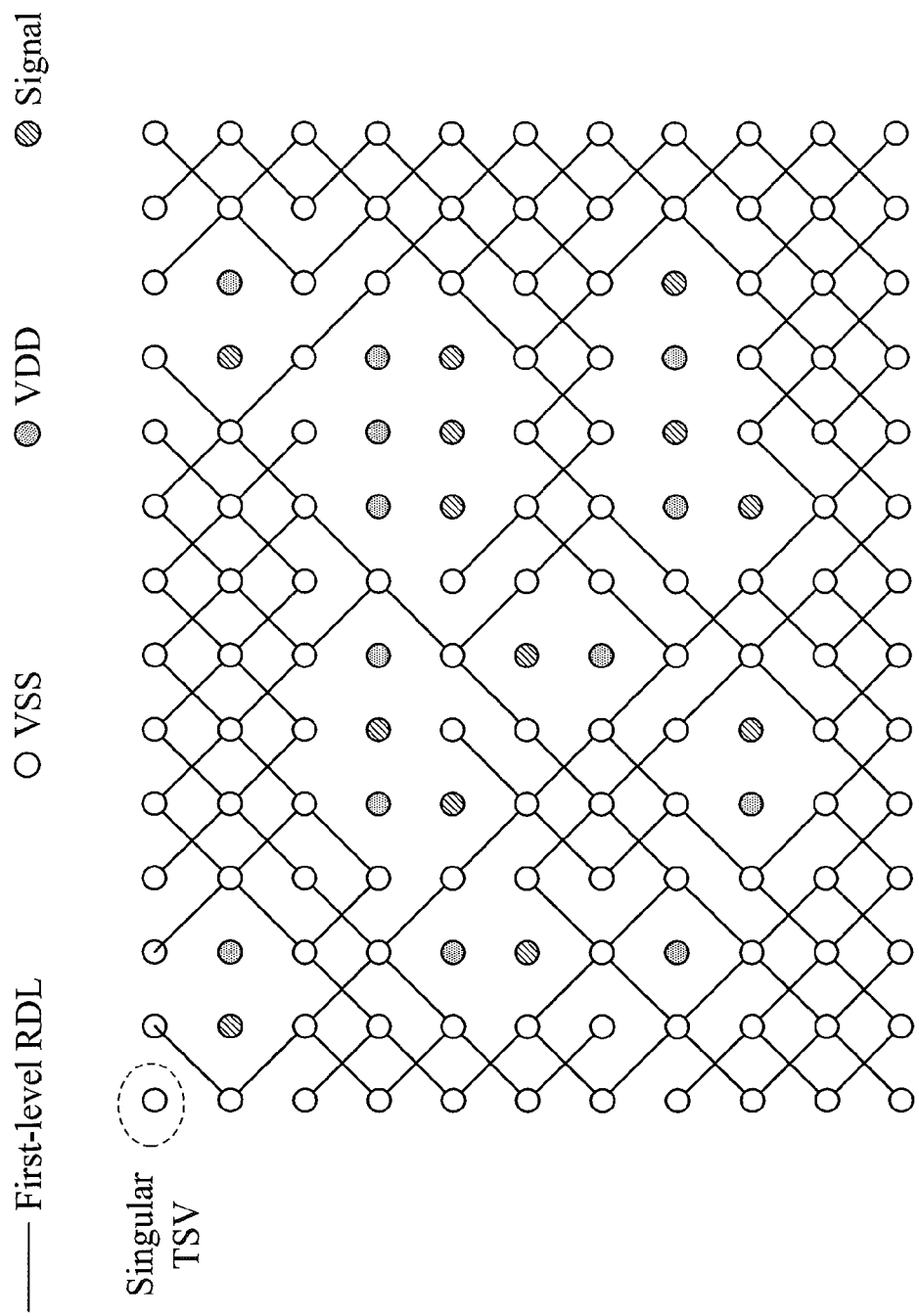
FIG. 5 shows a backside view of an integrated circuit layout in accordance with still another embodiment of the present invention.
Figure 6:
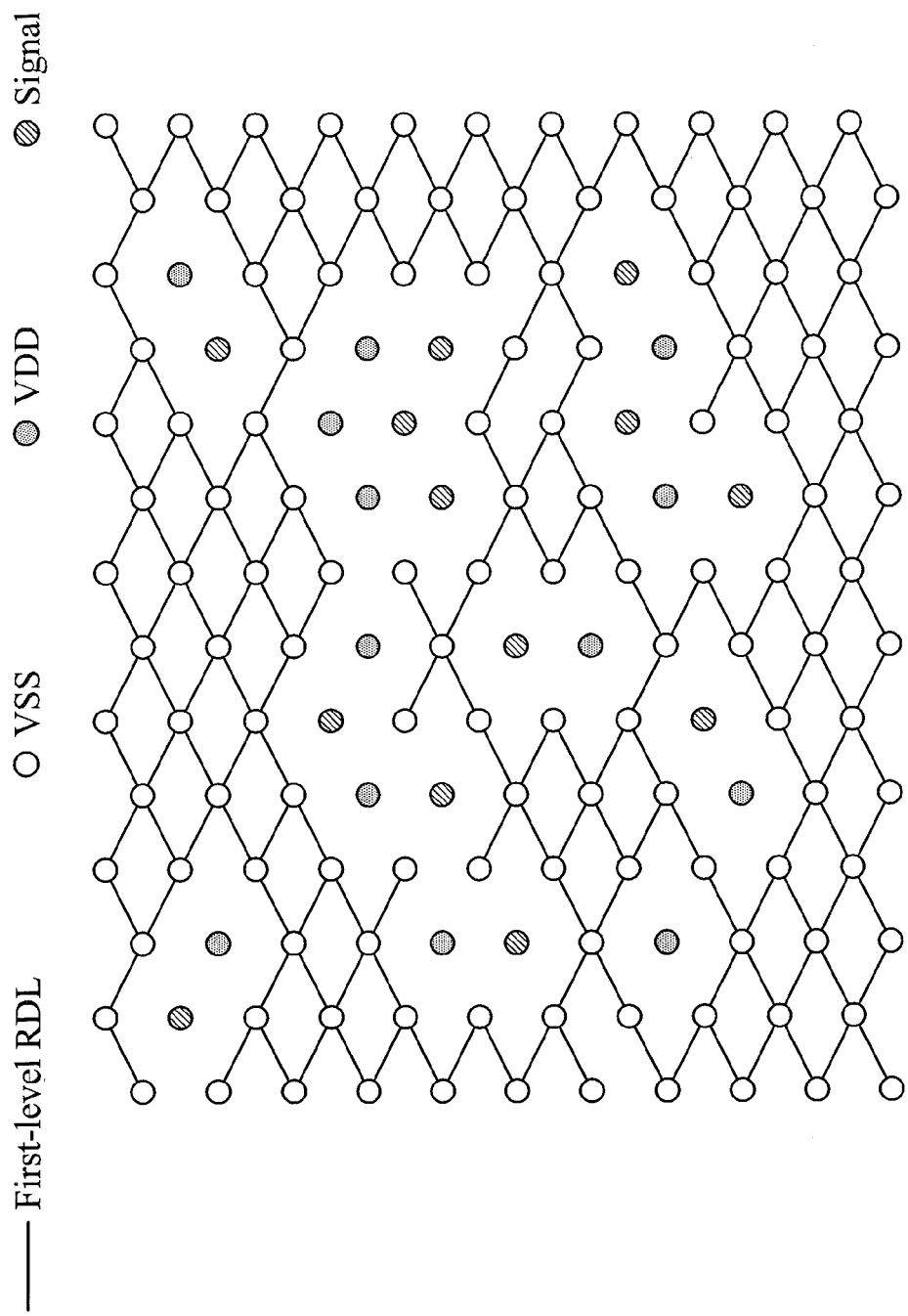
FIG. 6 shows a backside view of an integrated circuit layout in accordance with still another embodiment of the present invention.
Figure 8:
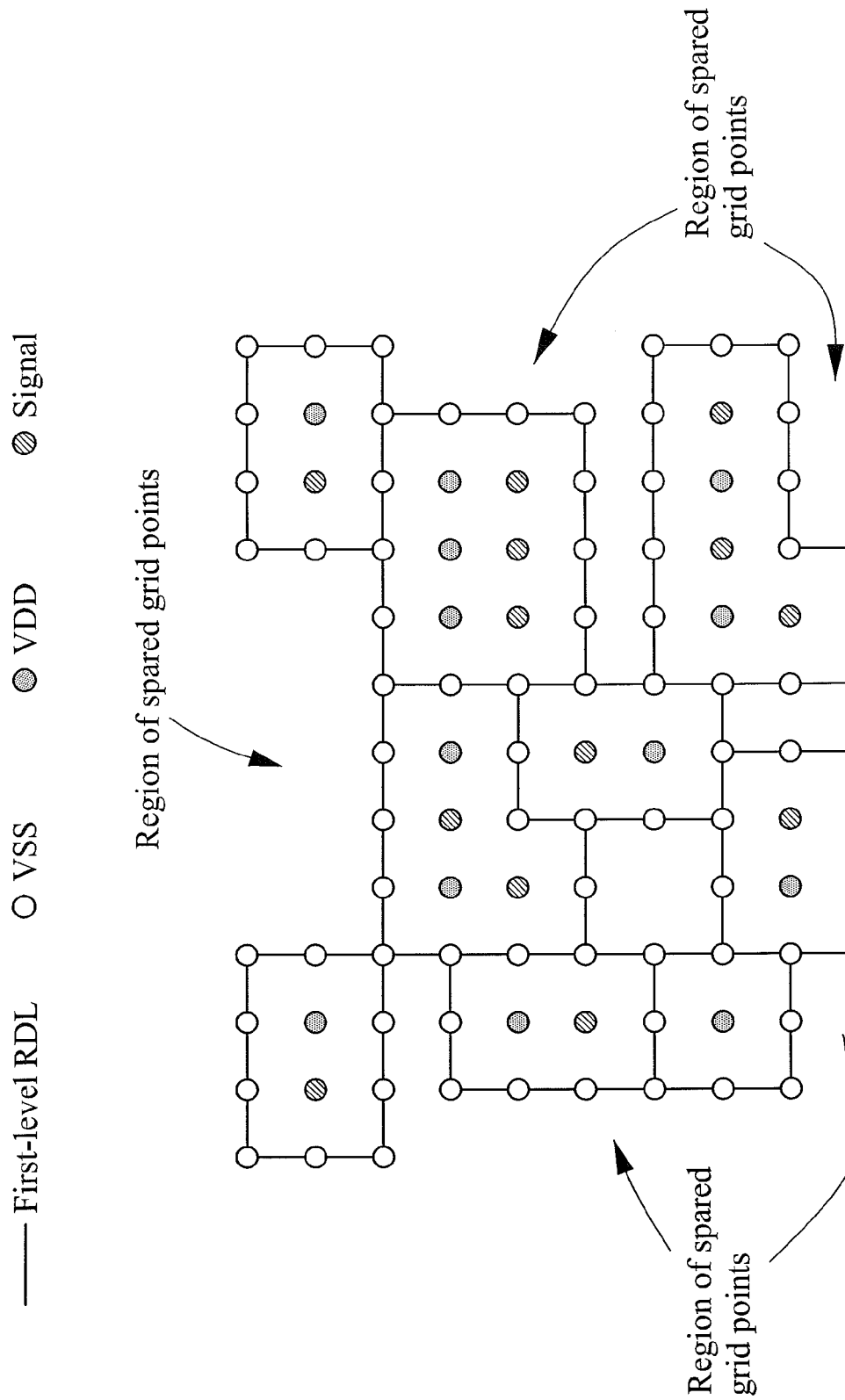
FIG. 8 shows a backside view of an integrated circuit layout in accordance with still another embodiment of the present invention.

Although in FIG. 4, on every grid point is a TSV and all the grid lines (except within VDD and/or signal TSV exempt regions) are taken by the first-level RDLs, that is, all the grid lines form VDD and/or signal TSV exempt regions, but the present invention is not limited thereto. Some of the exempt regions takes rectangular shape but others may be irregular-shaped. The VDD and/or signal TSV in one exempt region seem to be isolated from VDD and/or signal TSV in another exempt region, but they can be electrically connected by a second-level or higher-level RDL if needed. For example, a VDD TSV in one exempt region may be connected by a second-level RDL to another VDD TSV in another exempt region. A signal TSV in one exempt region may also be connected by a second-level RDL to another signal TSV in another exempt region. The first-level RDLs connecting all the TSVs outside the exempt regions need not to be horizontal and vertical, they may go diagonally as shown in FIG. 5. In that case, there may be at least a singular TSV outside the exempt region without being connected to the first-level RDLs, and every exempt region may or may not be rectangle-shaped. Or, if not so many TSVs are needed, some grid points can be spared with no TSV standing on it as shown in FIG. 8. Except changing the RDL orientation and/or sparing some grid points, the TSVs don't have stand on grid points. As shown in FIG. 6, the TSVs of even columns and the TSVs of odd columns are staggered.

Figure 7:
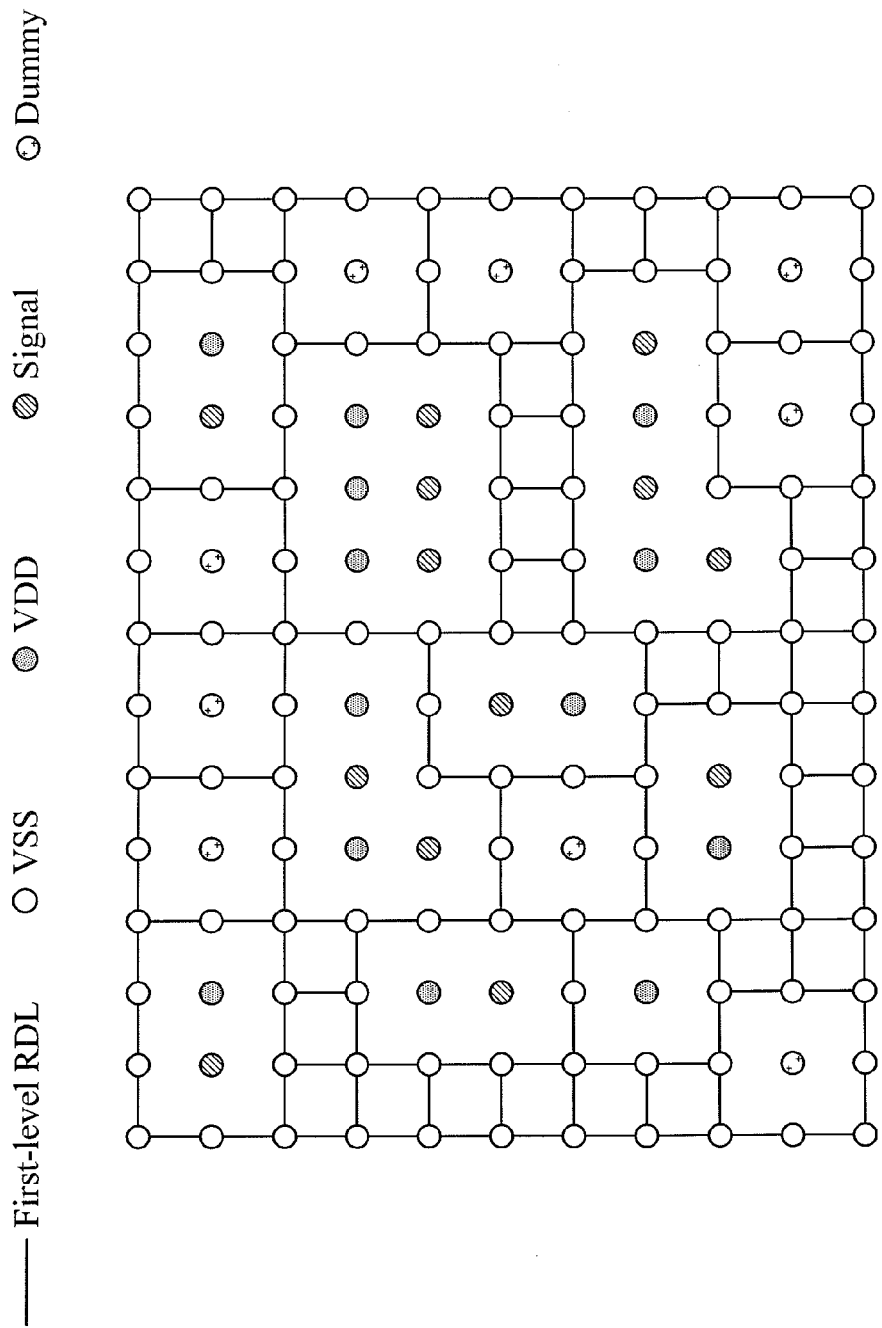
FIG. 7 shows a backside view of an integrated circuit layout in accordance with still another embodiment of the present invention.
Figure 9:
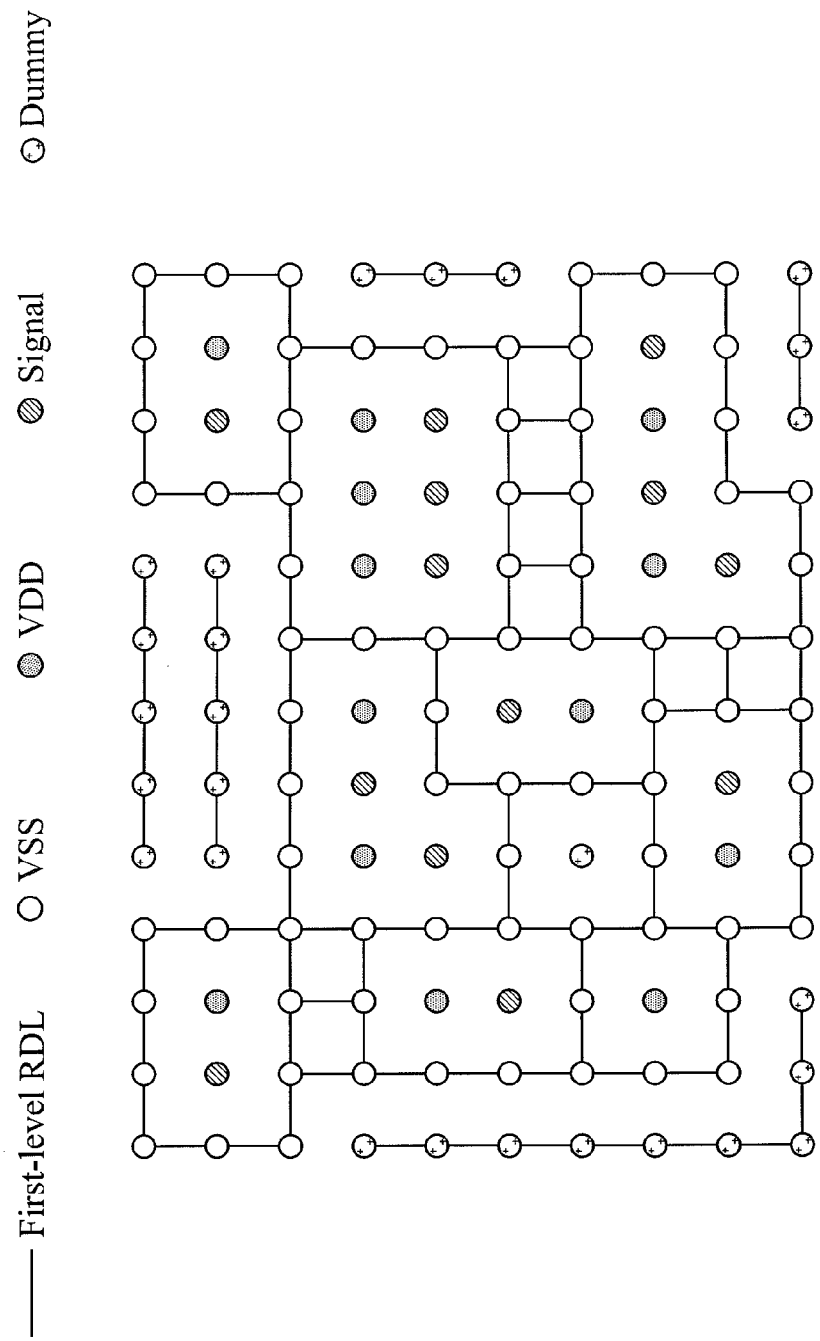
FIG. 9 shows a backside view of an integrated circuit layout in accordance with still another embodiment of the present invention.

Furthermore, different kind of TSVs such as dummy TSVs can be added into the system as shown in FIG. 7. Since dummy TSVs neither relay signal nor couple voltages, they can stand alone as shown in FIG. 7 and get surrounded by VSS TSVs and first-level RDLs connecting VSS TSVs. Or, the adjacent dummy TSVs can also be connected by one or more first-level RDLs forming a linear (as shown in FIG. 9) or irregular-shaped (not shown) heat dissipating structure, thereby improving heat dissipation.

After reading the previous paragraphs, a person skilled in the art may extract at least one feature from each embodiment of FIG. 4-9. It is important that the present invention not only comprise all of them but also their combinations in any way. For example, dummy TSVs can be added into all the embodiments of FIGS. 4-9 in any way. For example, spared grid points with no TSV standing on can be added into all the embodiments of FIGS. 4-9 in any way.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An integrated circuit layout, comprising:
   a through silicon via (TSV) configured to couple positive operational voltage VDD (VDD TSV);
   a through silicon via (TSV) configured to couple operational signals (signal TSV);
   a plurality of through silicon vias (TSVs) configured to couple operational voltage VSS (VSS TSVs) surrounding the VDD TSV and the signal TSV; and
   one or more backside redistribution lines (RDLs) of the same level connecting the VSS TSVs together to form a web-like heat dissipating structure completely surrounding the VDD TSV and the signal TSV,
   wherein the one or more backside RDLs of the same level run along a first direction and a second direction different from the first direction.

2. The integrated circuit layout of claim 1, wherein the VDD TSV, the signal TSV and the VSS TSVs form a grid and all stand on grid points.

3. The integrated circuit layout of claim 2, wherein the RDL of the same level connecting all the VSS TSVs together forms horizontal and vertical grid lines of the grid.

4. The integrated circuit layout of claim 3, wherein the RDL/RDLs of the same level connecting the VSS TSVs together is/are first-level RDLs.

5. The integrated circuit layout of claim 3, wherein the horizontal and vertical grid lines form multiple VDD and/or signal exempt regions to contain at least a VDD TSV and/or at least a signal TSV.

6. The integrated circuit layout of claim 5, wherein one VDD TSV in one exempt region is connected by a second-level RDL to another VDD TSV in another exempt region.

7. The integrated circuit layout of claim 5, wherein one signal TSV in one exempt region is connected by a second-level RDL to another signal TSV in another exempt region.

8. The integrated circuit layout of claim 5, wherein one of the VDD and/or signal exempt regions is rectangular-shaped.

9. The integrated circuit layout of claim 2, wherein the RDL of the same level connecting all the VSS TSVs together goes diagonally.

10. The integrated circuit layout of claim 9, wherein one of the VSS TSVs is not connected to the RDL/RDLs of the same level.

11. The integrated circuit layout of claim 1, wherein the VDD TSV, the signal TSV and the VSS TSVs form multiple staggered columns.

12. The integrated circuit layout of claim 1, wherein the RDL of the same level connecting all the VSS TSVs together goes diagonally.

13. The integrated circuit layout of claim 1, further comprising at least a dummy TSV.

14. The integrated circuit layout of claim 1, further comprising multiple dummy TSVs connected by a first-level RDL.

15. An integrated circuit layout, comprising:
   a through silicon via (TSV) configured to couple positive operational voltage VDD (VDD TSV);
   a through silicon via (TSV) configured to couple operational voltage VSS (VSS TSVs);
   a plurality of through silicon vias (TSVs) configured to couple operational signals (signal TSV) around the VDD TSV and the VSS TSV; and
   a plurality of backside redistribution lines (RDLs) of the same level, each of which connecting the signal TSVs of the same signal together to form a linear heat dissipating structure around the VDD TSV and the signal TSV,
   wherein some of the plurality of backside RDLs of the same level run along a first direction and others of the plurality of backside RDLs of the same level run along a second direction different from the first direction.

16. The integrated circuit layout of claim 15, wherein the RDLs of the same level connecting the signal TSVs together are first-level RDLs.

17. The integrated circuit layout of claim 15, further comprising another VDD TSV connected to the VDD TSV by a second-level RDL.

18. The integrated circuit layout of claim 15, further comprising another VSS TSV connected to the VSS TSV by a second-level RDL.

19. The integrated circuit layout of claim 15, further comprising at least a dummy TSV.

20. The integrated circuit layout of claim 15, further comprising multiple dummy TSVs connected by a first-level RDL.

* * * * *